(12) United States Patent
Kim

(10) Patent No.: US 12,341,509 B2
(45) Date of Patent: Jun. 24, 2025

(54) SYSTEMS AND METHODS FOR IMPROVED RELIABILITY IN VOLTAGE LEVEL SHIFTERS

(71) Applicant: Micron Technology, Inc., Boise, ID (US)

(72) Inventor: Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 18/542,585

(22) Filed: Dec. 15, 2023

(65) Prior Publication Data

US 2024/0356554 A1 Oct. 24, 2024

Related U.S. Application Data

(60) Provisional application No. 63/460,800, filed on Apr. 20, 2023.

(51) Int. Cl.
*H03K 19/003* (2006.01)
*H03K 19/0185* (2006.01)

(52) U.S. Cl.
CPC ........... *H03K 19/018521* (2013.01); *H03K 19/00315* (2013.01); *H03K 19/018528* (2013.01)

(58) Field of Classification Search
CPC ... H03K 19/00315; H03K 19/018514–018528
See application file for complete search history.

(56) References Cited

U.S. PATENT DOCUMENTS

| | | | | |
|---|---|---|---|---|
| 6,801,064 B1 * | 10/2004 | Hunt | ................ | H03K 19/00315 327/333 |
| 2008/0252354 A1 * | 10/2008 | Koto | .............. | H03K 19/018521 327/321 |
| 2012/0013386 A1 * | 1/2012 | Kumar | ........... | H03K 19/018528 327/333 |

* cited by examiner

*Primary Examiner* — Patrick O Neill
(74) *Attorney, Agent, or Firm* — Fletcher Yoder, P.C.

(57) ABSTRACT

A memory device includes a level shifting circuitry. The level shifting circuitry includes an input circuitry configured to receive an input to the level shifting circuitry in a first voltage domain. The level shifting circuitry also includes a cross-junction circuitry electrically coupled to a first node of the input circuitry comprising multiple transistors that are electrically coupled in a cross-junction. The level shifting circuitry also includes an output staging circuitry electrically coupled to a second node of the cross-junction circuitry. The output staging circuitry is configured to transmit an output in a second voltage domain. The output staging circuitry includes a transistor and voltage stress reduction circuitry configured to mitigate degradation of the transistor by reducing voltage stresses across the transistor during transitions in the level shifting circuitry.

20 Claims, 6 Drawing Sheets

SYSTEMS AND METHODS FOR IMPROVED RELIABILITY IN VOLTAGE LEVEL SHIFTERS

CROSS-REFERENCE TO RELATED APPLICATIONS

This application claims priority to U.S. Provisional Application No. 63/460,800, filed Apr. 20, 2023, entitled "System and Methods for Improved Reliability in Voltage Level Shifters," the disclosure of which is incorporated by reference herein in its entirety for all purposes.

BACKGROUND

Field of the Present Disclosure

The present disclosure relates to level shifters, and more specifically, to high-voltage (e.g., above 3V) level shifters.

Description of Related Art

Certain read/write memory devices, such as dynamic random access memory (DRAM), include arrays having memory cells that store information. For example, certain DRAM devices, such as synchronous dynamic RAM (SDRAM) devices may have multiple memory banks having many addressable memory elements or cells included in memory arrays. In use, memory devices, such as the SDRAM devices may receive data input signals at high speeds, such as speeds of 1 gigabits per second (Gbps) or more, and store data in the memory cells based on the data input signals. Level shifters may be used, for example, to translate signals from one logic level or voltage domain (e.g., 1V, 2V, or 3V) to another (e.g., about 4.2V), thus enabling a bridge between domains in processors, logic, sensors, and the like. However, the relatively high voltages (e.g., 3.3V) across circuitry components (e.g., transistors) may cause the components to degrade with time potentially causing reliability issues with the level shifters.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) devices coupled to processing circuitry, and the memory devices may provide storage for data processing. Examples of RAM devices include dynamic RAM (DRAM) devices and synchronous DRAM (SDRAM) devices, which may store individual bits electronically. The stored bits may be organized into addressable memory elements (e.g., words), which may be stored in memory banks. To receive and to transmit the bits, the RAM devices may include certain data communications circuitry as well as communication lines useful in saving and retrieving the bits from the memory bank. In certain DRAM and SDRAM devices, level shifters may include circuitry that shifts certain signals, e.g., voltage signals, from a certain first voltage range (e.g., 0V to 3V) to a second voltage range (e.g., 3-4.2V). As used herein, high-voltage refers to a high voltage for electronics devices, such as greater than 3V or 4V. As previously noted, the relatively high voltages (e.g., 3.3V) across circuitry components (e.g., transistors) of the level shifters may cause the components to degrade with time potentially causing reliability issues with the level shifters. To mitigate reliability and/or degradation issues, the level shifters may be supplemented with voltage stress reduction circuitry to reduce stress to the circuit components.

Figure 1:
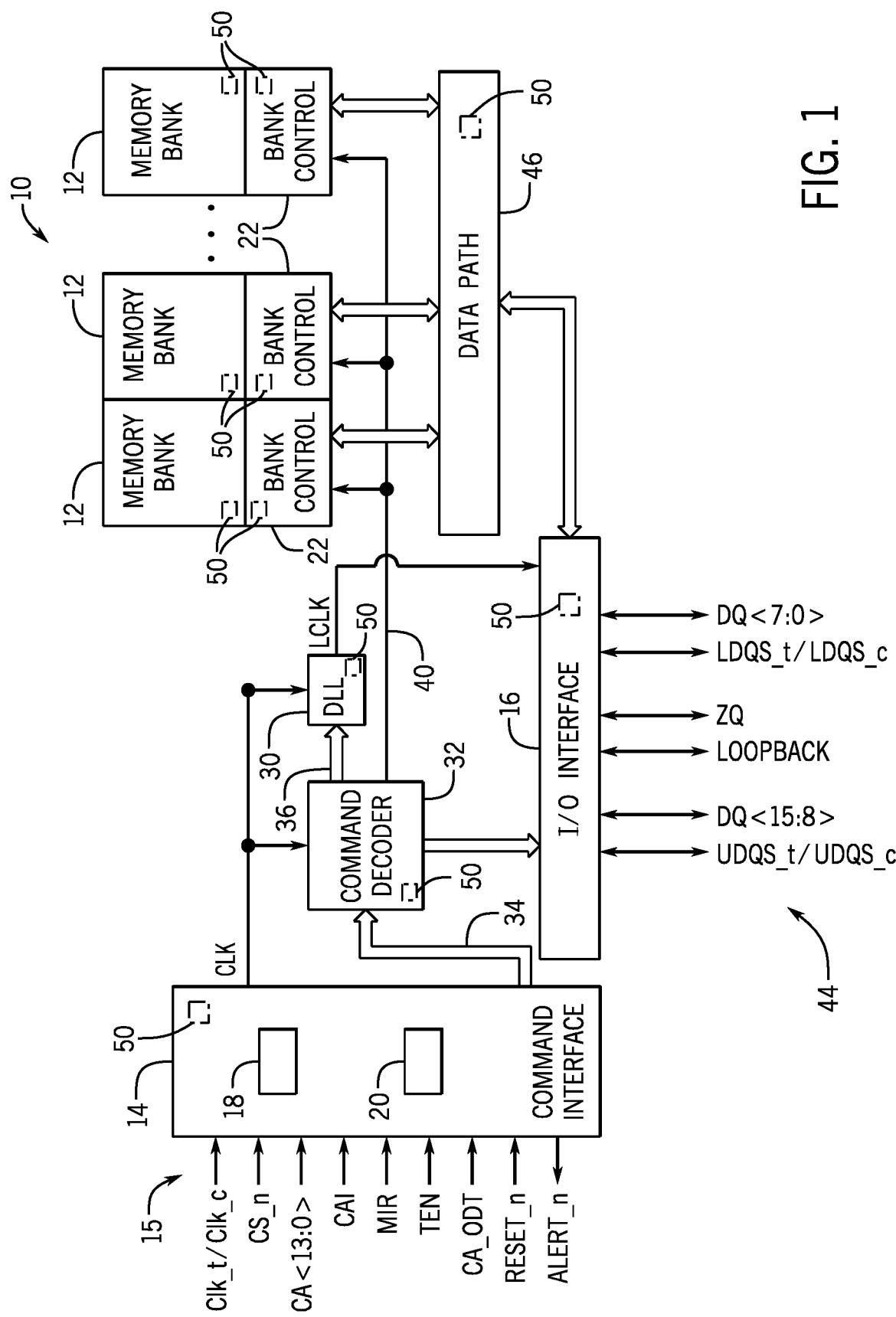
FIG. 1 is a block diagram illustrating an organization of a memory device that may include one or more level down shifting drivers, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM as further described herein allow for reduced power consumption, more bandwidth, and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command (WrCmd), etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface 14 may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data for read and write commands may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance. The data (e.g., IO signals) for read and writes may be addressed to certain memory (e.g., memory cells) in the memory banks 12.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. As will also be appreciated, various components, such as the command interface 14, the command decoder 32, the DLL 30, the I/O interface 16, memory banks 12, bank control 22, and/or data path 46, may include one or more level shifting circuitries 50. The level shifting circuitries 50 may be unidirectional and may receive an input to be converted from a first voltage domain to a second voltage domain. For example, the input signals may be used to convert a first voltage into a second voltage, the second voltage at a lower or higher voltage level than the first voltage. The conversion may be useful to translate signals from one logic level or voltage domain to another logic level (e.g., higher or lower logic level), thus enabling a bridge between domains in components of the memory device 10. Accordingly, it should be understood that the block diagram of FIG. 1 is only provided to highlight certain functional features of the memory device 10 to aid in the subsequent detailed description. The level shifting circuitries 50 may be used to perform voltage level conversions at many suitable locations. For instance, in the command decoder 32, one or more level shifting circuitries 50 may be included for a row decoding system that may use high voltages (e.g., 4.2V). The level shifting circuitries 50 may be included at various other locations in the memory device 10. It is also to be noted that the level shifting circuitries 50 described herein may be useful in other systems, such as microprocessors, sensors, other memory devices, logic circuits, and any other electronic devices using multiple voltage levels.

Figure 2:
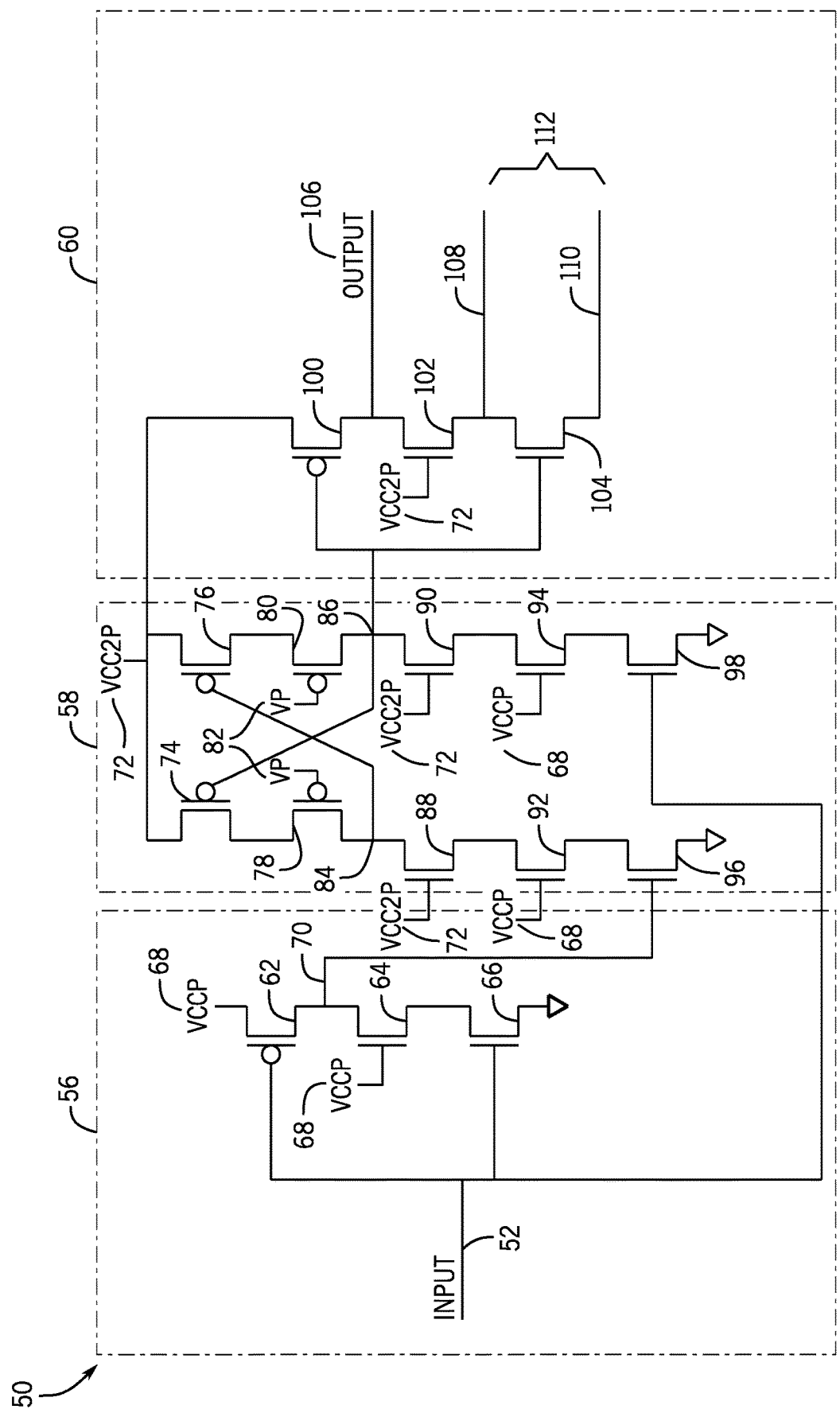
FIG. 2 is a circuit diagram of a high-voltage level shifter, in accordance with an embodiment.

It would be beneficial to illustrate an embodiment of an embodiment of the level shifting circuitry 50. Accordingly, FIG. 2 depicts an embodiment of a level shifting circuitry 50 having an input 52. It is to be understood that the depicted embodiment is a simplified example only, useful for illustration, and that other embodiments of level shifting circuitries 50 may include more or less components and/or connections. The level shifting circuitry 50 may be divided into an input circuitry 56, a cross-junction circuitry 58, and an output staging circuitry 60.

In the depicted embodiment, the input circuitry 56 may include three transistors 62, 64, and 66. The transistor 62 may be a P-type transistor (e.g., metal oxide field effect transistor (MOSFET)) while the transistors 64 and 66 may be N-type transistors (e.g., MOSFETs). As illustrated, the input 52 may be connected to gate terminals of transistors 62 and 66. Another voltage (VCCP) 68 may be connected to a gate terminal of the transistor 64. The VCCP 68 may be a voltage supply that provides a DC voltage between 0V to 3.1V. A first terminal of the transistor 62 may also be coupled to the VCCP 68 while a second terminal of the transistor 62 is coupled to a first terminal of the transistor 64. A second terminal of the transistor 64 may be coupled to a first terminal of the transistor 66 while a second terminal of the transistor 66 is coupled to a common return (e.g., ground).

Since the gate terminal of the transistor 64 is coupled to the VCCP 68 and is an N-type transistor, the transistor 64 couples the transistor 62 and the transistor 66 as long as the amplitude of the VCCP 68 is above a threshold voltage of the transistor 64. Furthermore, since the transistor 62 is a P-type transistor and the transistor 66 is a N-type transistor with their respective gate terminals tied to the input 52, the input 52 controls whether a node 70 is coupled to the VCCP 68 or the common return via the transistor 66. For instance, if the input 52 is above a threshold voltage for the transistor 66, the transistor 66 may couple the node 70 to the common return via the transistor 64. If the input 52 is below the threshold voltage for the transistor 62, the transistor 62 may couple the node 70 to the VCCP 68. The threshold voltage of the transistors 62 and 66 may be the same as each other in some embodiments and different than each other in different embodiments.

The cross-junction circuitry 58 uses a voltage (VCC2P) 72 (e.g., 4.2V) that is higher than the VCCP 68 to output a higher voltage from the level shifting circuitry 50 than is received at the input 52. The VCC2P 72 may be a voltage supply that provides a DC voltage between >3.1V (e.g., 4.2V). The cross-junction circuitry 58 includes transistors 74, 76, 78, and 80 that are electrically coupled in a cross-junction. The transistors 74, 76, 78, and 80 are P-type transistors (e.g., MOSFETs). First respective terminals of the transistors 74 and 76 are coupled to the VCC2P 72, and second terminals of the transistors 74 and 76 are coupled to first terminals of the transistors 78 and 80, respectively. The gate terminals of the transistors 78 and 80 are coupled to a common voltage 82. The common voltage may be less than the VCCP 68 and/or the VCC2P 72. Second terminals of the transistors 78 and 80 are coupled to nodes 84 and 86, respectively. The gate terminal of the transistor 74 is coupled to the node 86, and the gate terminal of the transistor 76 is coupled to the node 84.

The cross-junction circuitry 58 also includes transistors 88, 90, 92, 94, 96, and 98. The transistors 88, 90, 92, 94, 96, and 98 may be N-type transistors (e.g., MOSFETs). The connection between the input circuitry 56 and the cross-junction circuitry 58 may be via the node 70 being coupled to the gate terminal of the transistor 96. First terminals of the transistors 88 and 90 are coupled to the nodes 84 and 86, respectively. Second terminals of the transistors 88 and 90 are coupled to first terminals of the transistors 92 and 94, respectively. Second terminals of the transistors 92 and 94 are coupled to first terminals of the transistors 96 and 98, respectively. Second terminals of the transistors 96 and 98 are coupled to a common return (e.g., ground). In some embodiments, the transistors 66, 96, and 98 may be coupled to a same common return (e.g., global ground or global voltage level), or at least one of the transistors 66, 96, and 98 may use a different common return (e.g., local ground or voltage level).

The signal at the node 86 is transmitted to the output staging circuitry 60 as the output of the cross-junction circuitry 58. Specifically, the output staging circuitry 60 includes transistors 100, 102, and 104. The transistor 100 may be an N-type transistor (e.g., MOSFET), and the transistors 102 and 104 may be a P-type transistor (e.g., MOSFET). The node 86, as the output of the cross-junction circuitry 58, is coupled to gate terminals of the transistors 100 and 104. A first terminal of the transistor 100 is coupled to the VCC2P 72. A second terminal of the transistor 100 is coupled to a first terminal of the transistor 102. An output 106 of the level shifting circuitry 50 is output between the second terminal of the transistor 100 and a first terminal of the transistor 102. A second terminal of the transistor 102 is coupled to a first terminal of the transistor 104 with some voltage 108 output between the second terminal of the transistor 102 and the first terminal of the transistor 104. A second terminal of the transistor 104 is coupled to a voltage 110 that may be controlled to control a shape/voltage of the output 106.

The output 106 is controlled by the voltage of the node 86. Specifically, if the voltage of the node 86 is above a threshold voltage of the transistor 104, the output 106 is coupled to the voltage 110 as long as VCC2P 72 is on (and above the threshold voltage of the transistor 102). However, if the voltage of the node 86 is instead below the threshold voltage of the transistor 100, the output 106 is coupled to the elevated level of the VCC2P 72. Thus, the output 106 may be equal to the voltage (e.g., 4.2V) of the VCC2P 72. Furthermore, since the voltage 110 may be programmably controllable, the output 106 may be set to different voltages carried on the voltage 110. For instance, the output 106 may be set to a first value (e.g., −0.2V) or a second value (e.g., 1.8V) depending on the value of the voltage 110. As discussed below, a relatively large voltages difference 112 (e.g., 3.3V) across the transistor 104 may cause the transistor 104 to degrade over time. For instance, the transistor 104 may be over ¾ degraded over a period of time (e.g., 10 years). Accordingly, during/after this period of time, the level shifting circuitry 50 may become at least partially unreliable.

Figure 3:
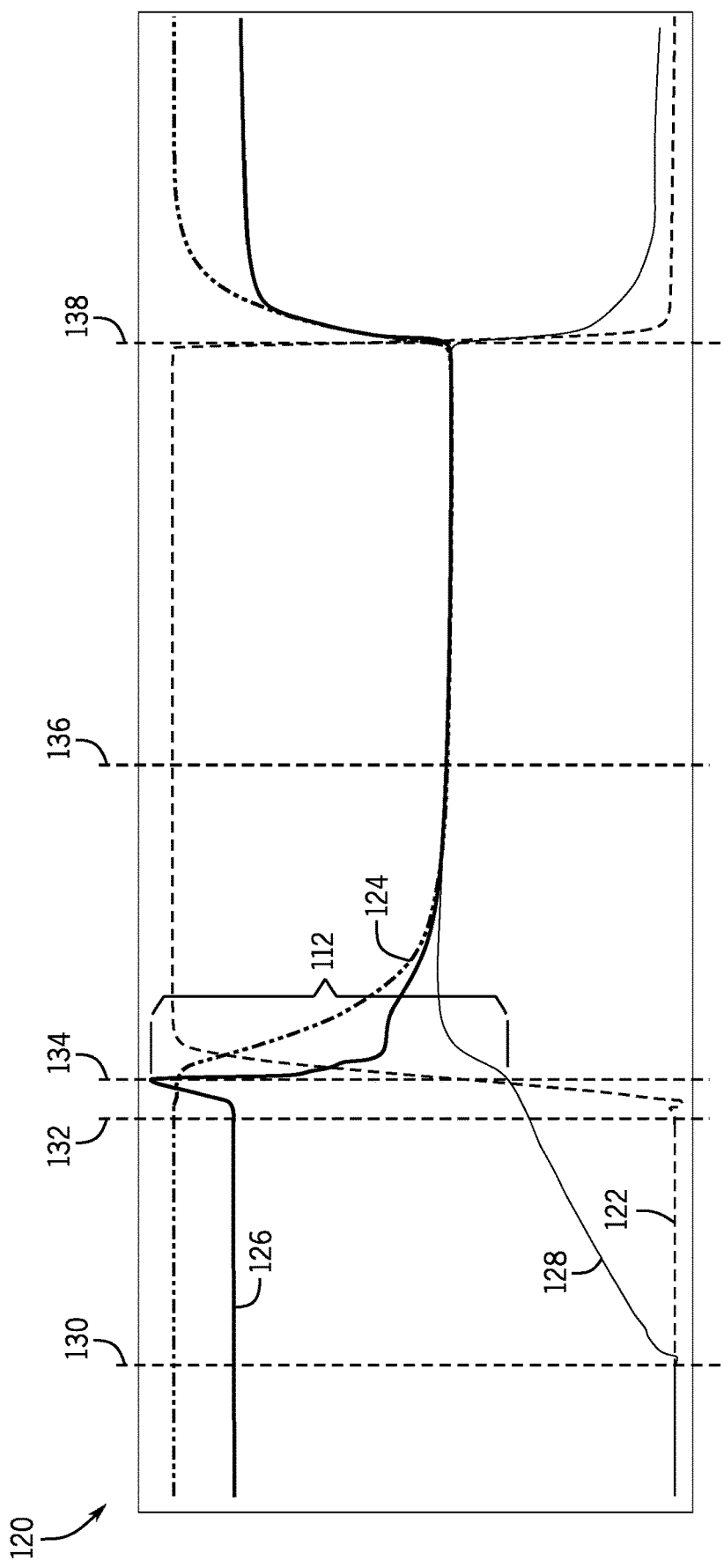
FIG. 3 is a graph of voltages in the high-voltage level shifter of FIG. 2, in accordance with an embodiment.

FIG. 3 is a graph 120 of operation of level shifting circuitry 50 of FIG. 2. As illustrated, the graph 120 includes lines 122, 124, 126, and 128. The line 122 corresponds to a voltage at the node 86 that corresponds to whether the level shifting circuitry 50 is selected and whether the output 106 is to be a logic high or a logic low. The line 124 corresponds to a voltage level of the output 106. The line 126 corresponds to a voltage level of the voltage 108. Similarly, the line 128 corresponds to the voltage 110. At time 130, the input variable voltage of the voltage 110 is increased to precharge the level shifting circuitry 50 (e.g., the node 86 and the voltage 108). Further, at time 130, the voltage of node 86 causes the output 106 to be logically high by causing the transistor 100 to be coupled to the VCC2P 72. At time 132, the voltage of the node 86 begins increasing due to the selection of the level shifting circuitry 50. When the voltage of the node 86 increases above the threshold of the transistor 100, the output 106 decouples from the VCC2P 72 while the output 106 is coupled to the voltage 108 and the voltage 110 through the transistors 102 and 104. However, during this transition at time 134, a capacitance of the load on the output 106 causes the voltage 108 to spike causing the voltage difference 112 between the voltage 108 and the voltage 110 to spike increasing stress to the transistor 104 (e.g., "victim transistor"). This increased stress to the transistor 104 may increase degradation of the transistor 104. For instance, 75% or more manufactured level shifting circuitries 50 may have their respective transistors 104 degraded over 10 years. This degradation may decrease reliability of the level shifting circuitry 50 significantly. After settling (e.g., time 136), the voltage of the node 86, the voltage 108, and the voltage 110 are at the same pre-charged level (e.g., 1.8V). When a pulse of the voltage at the node 86 ends at time 138, the output 106 returns to logic high (e.g., 4.2V) and the output 106 is driven to a lower level (e.g., −0.2V). If the level shifting circuitry 50 were not selected, at time 138, the output may be driven to the lower level.

Figure 4:
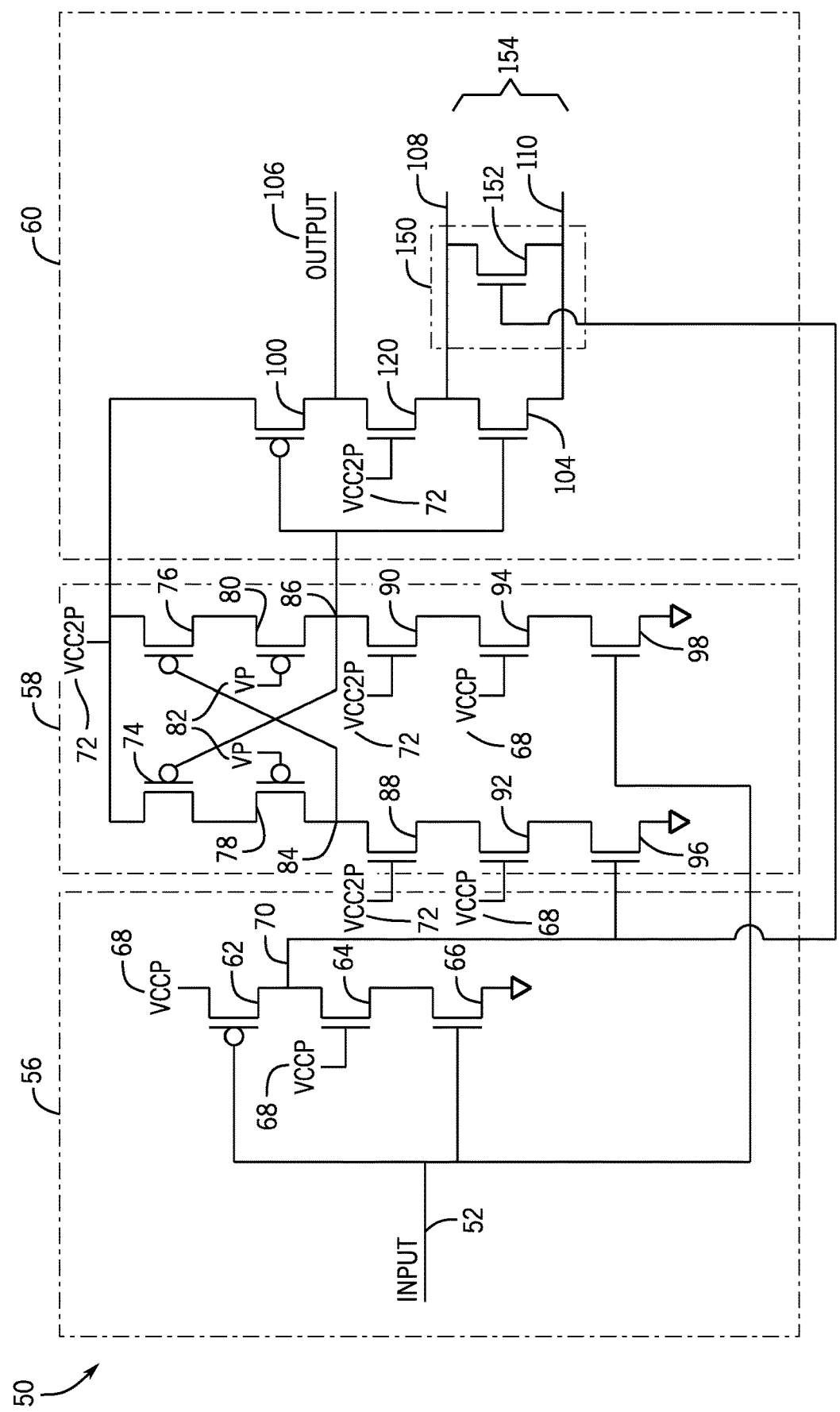
FIG. 4 is a circuit diagram of a high-voltage level shifter using voltage stress reduction circuitry, in accordance with an embodiment.

FIG. 4 is a circuit diagram depicting an embodiment of the level shifting circuitry 50 with improved reliability. To address the degradation of the transistor 104, the level shifting circuitry 50 may be supplemented with voltage stress reduction circuitry 150. The voltage stress reduction circuitry 150 includes a transistor 152 that is connected in parallel to the victim transistor (transistor 104) between the voltage 108 and the voltage 110. A gate terminal of the transistor 152 is coupled to the node 70. The transistor 152 may be of the same type as the victim transistor (e.g., N-type) but may be smaller than the victim transistor. Accordingly, when a voltage of the node 70 surpasses the threshold voltage of the transistor 152, the transistor 152 bleeds/dissipates charge from the voltage 108 to the voltage 110 to reduce the spike in the voltage difference 112. Since the transistor 152 is smaller than the transistor 104, the transistor 104 may still perform the bulk of the transmission of charge from the voltage 108 to the voltage 110 but reducing a voltage difference 154 compared to the voltage difference 112 thereby reducing the voltage stress on the transistor 104.

Figure 5:
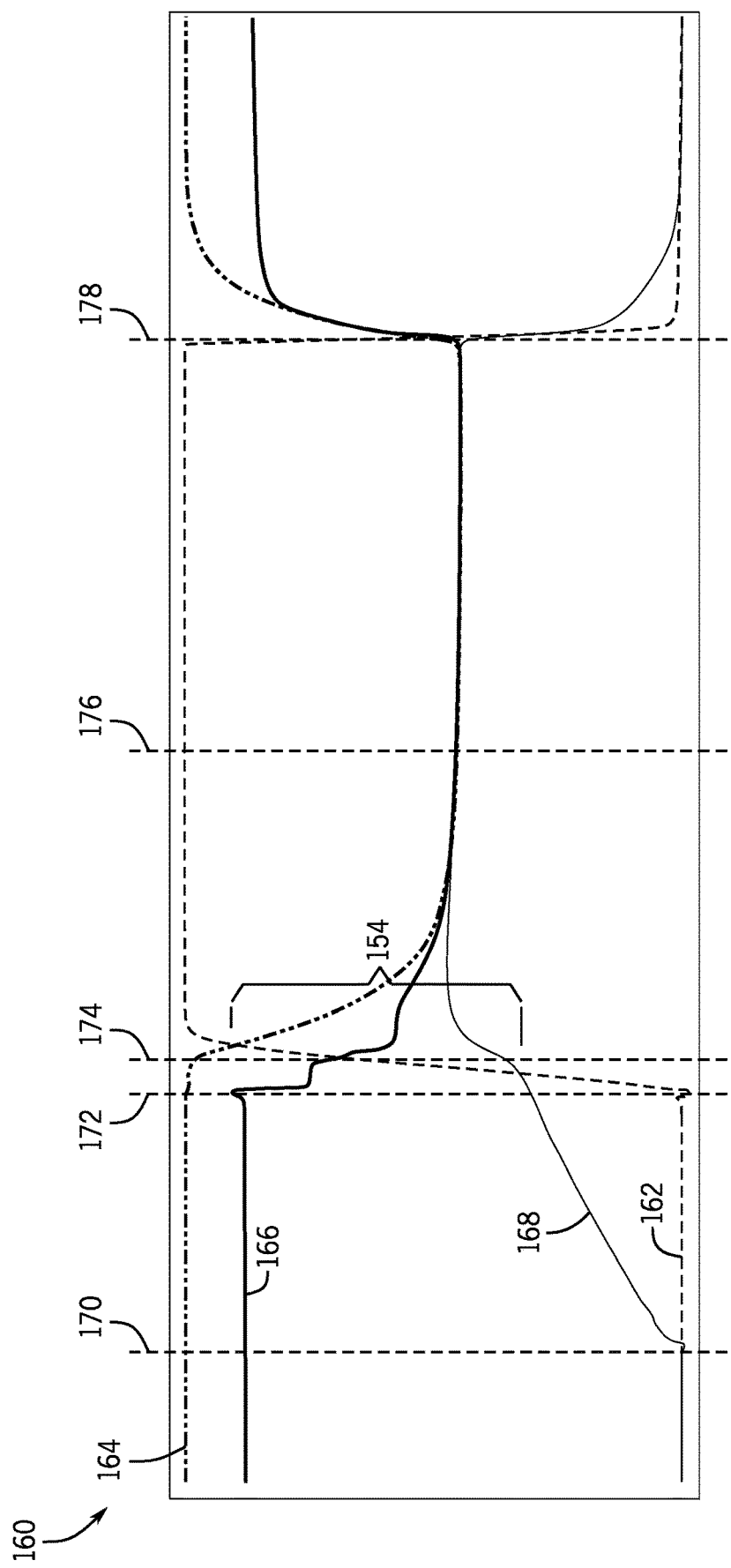
FIG. 5 is a graph of voltages in the high-voltage level shifter of FIG. 4, in accordance with an embodiment.

FIG. 5 is a graph 160 of operation of the embodiment of the level shifting circuitry 50 of FIG. 4 having voltage stress reduction circuitry 150. As illustrated, the graph 160 includes lines 162, 164, 166, and 168. The line 162 corresponds to a voltage at the node 86 that corresponds to whether the level shifting circuitry 50 is selected and whether the output 106 is to be a logic high or a logic low. The line 164 corresponds to a voltage level of the output 106. The line 166 corresponds to a voltage level of the voltage 108. Similarly, the line 168 corresponds to the voltage 110. At time 170, the input variable voltage of the voltage 110 is increased to precharge the level shifting circuitry 50 (e.g., the node 86 and the voltage 108). Further, at time 170, the voltage of node 86 causes the output 106 to be logically high by causing the transistor 100 to be coupled to the VCC2P 72. At time 172, the voltage of the node 86 begins increasing due to the selection of the level shifting circuitry 50. When the voltage of the node 86 increases above the threshold of the transistor 100, the output 106 decouples from the VCC2P 72 while the output 106 is coupled to the voltage 108 and the voltage 110 through the transistors 102 and 104. During this transition at time 174, a capacitance of the load on the output 106 is bled/dissipated to the voltage 110. Thus, a voltage difference 154 between the voltage 108 and the voltage 110 spikes at a lower voltage level (e.g., 1.9V) when compared to the voltage difference 112. Thus, the voltage stress reduction circuitry 150 is used to decrease stress to the victim transistor (transistor 104). This reduced stress to the transistor 104 may decrease degradation of the transistor 104 when compared to the embodiments of the level shifting circuitry 50 without the voltage stress reduction circuitry 50. For instance, 10% or less manufactured level shifting circuitries 50 may have their respective transistors 104 degraded over 10 years resulting in higher reliability when compared to the reliability of level shifting circuitries 50 without the voltage stress reduction circuitry 150. After settling (e.g., time 176), the voltage of the node 86, the voltage 108, and the voltage 110 are at the same pre-charged level (e.g., 1.8V). When a pulse of the voltage at the node 86 ends at time 178, the output 106 returns to logic high (e.g., 4.2V) and the output 106 is driven to a lower level (e.g., −0.2V).

Figure 6:
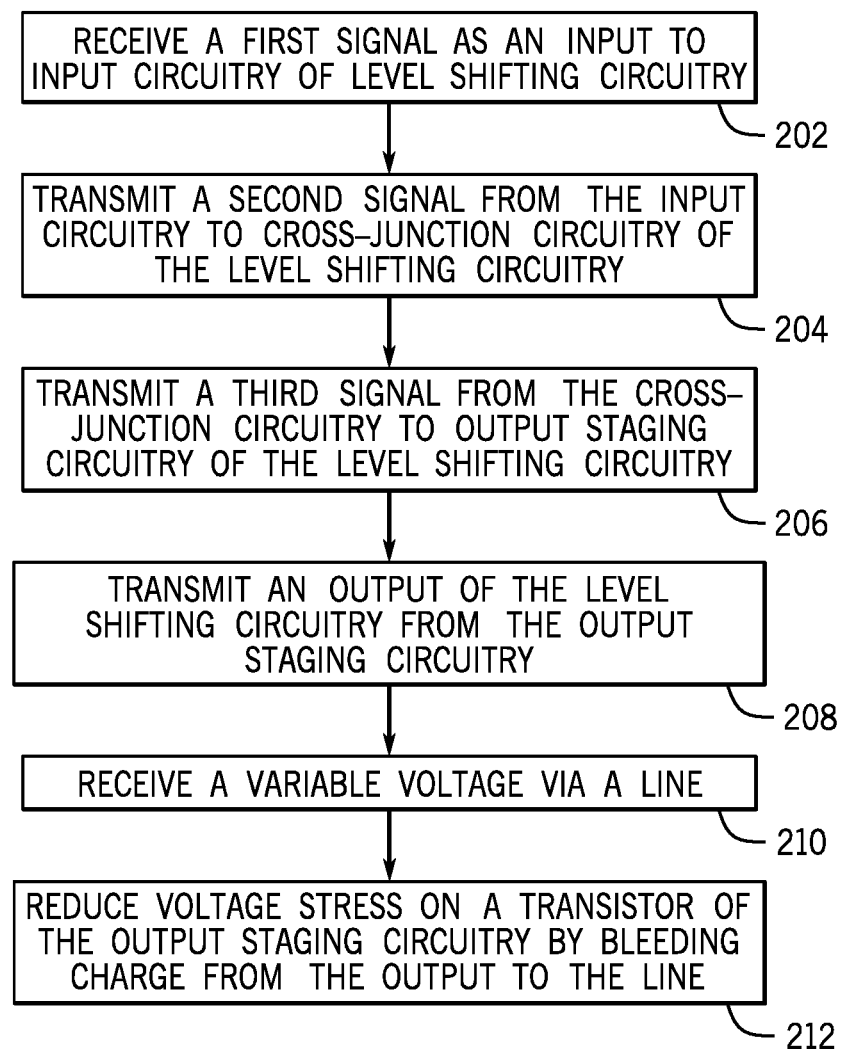
FIG. 6 is a flow chart of a process for using the voltage stress reduction circuitry of FIG. 4, in accordance with an embodiment.

FIG. 6 is a flow diagram of a process 200 for operating the level shifting circuitry 50 of FIG. 4. The process includes receiving a first signal as an input of input circuitry 56 of the level shifting circuitry (block 202). The first signal (input 52) is received in a first voltage domain. The node 70 transmits a second signal from the input circuitry 56 to cross-junction circuitry 58 electrically connected to the input circuitry 56 (block 204). The node 86 of the cross-junction circuitry 58 transmits a third signal from the cross-junction circuitry 58 to output staging circuitry 60 (block 206). A pulse on the third signal may be indicative that the line shifting circuitry 50 has been selected. The output staging circuitry 60 then transmits the output 106 of the level shifting circuitry 50 (block 208). The output 106 may be in a second voltage domain. For instance, the second voltage domain may have a higher maximum value (e.g., 4.2V) than the first voltage domain (e.g., 3.3V) or vice versa. The output staging circuitry 60 also receives a variable voltage via a line, such as the voltage 110 (block 210). The voltage stress reduction circuitry 150 of the output staging circuitry 60 reduces voltage stress on the transistor 104 of the output staging circuitry 60 by bleeding charge from the output to the line (block 212).

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device, comprising:
    a level shifting circuitry, comprising:
    an input circuitry configured to receive an input to the level shifting circuitry in a first voltage domain;
    a cross-junction circuitry electrically coupled to a first node of the input circuitry comprising a first plurality of transistors that are electrically coupled in a cross-junction; and
    an output staging circuitry electrically coupled to a second node of the cross-junction circuitry, wherein the output staging circuitry is configured to transmit an output in a second voltage domain, wherein the output staging circuitry comprises:
    a transistor; and
    voltage stress reduction circuitry configured to mitigate degradation of the transistor by reducing voltage stresses across the transistor during transitions in the level shifting circuitry, wherein the voltage stress reduction circuitry comprises a stress reduction transistor coupled in parallel with the transistor.

2. The memory device of claim 1, wherein the stress reduction transistor is smaller than the transistor.

3. The memory device of claim 1, wherein a gate terminal of the stress reduction transistor is coupled to the first node.

4. The memory device of claim 3, wherein the stress reduction transistor is configured to bleed charge from the output when a voltage level of the first node crosses a threshold of the stress reduction transistor.

5. The memory device of claim 1, wherein the stress reduction transistor is configured to bleed charge from the output when a voltage level of the second node crosses a threshold of the stress reduction transistor.

6. The memory device of claim 5, wherein the output staging circuitry comprises a first transistor coupled between the output and the transistor, and bleeding charge from the output comprises bleeding charge via the second transistor.

7. The memory device of claim 6, wherein a gate terminal of the second transistor is coupled to a voltage supply of the second voltage domain.

8. The memory device of claim 7, wherein the output staging circuitry comprises a third transistor coupled between the voltage supply and the output.

9. The memory device of claim 8, wherein the stress reduction transistor, the transistor, and the second transistor are N-type transistors, and the third transistor is a P-type transistor.

10. The memory device of claim 8, wherein the respective gate terminals of the transistor and the third transistor are coupled to the second node of the cross-junction circuitry.

11. A method for operating level shifting circuitry of a memory device, comprising:
    receiving a first signal as an input of input circuitry of the level shifting circuitry, wherein the first signal is in a first voltage domain;
    transmitting a second signal from the input circuitry to cross-junction circuitry electrically connected to the input circuitry;
    transmitting a third signal from the cross-junction circuitry to output staging circuitry;
    transmitting an output from the output staging circuitry that is in a second voltage domain;
    receiving a variable voltage via a line from a variable voltage supply; and
    reducing voltage stress on a transistor of the output staging circuitry by bleeding charge from the output to the line.

12. The method of claim 11, wherein reducing voltage stress on the transistor comprises using a bleed transistor that is coupled in parallel to the transistor between a voltage node and the line.

13. The method of claim 12, wherein bleeding the charge comprises sending the second signal to a gate terminal of the bleed transistor.

14. The method of claim 11, wherein the second voltage domain has a higher maximum voltage than the first voltage domain.

15. Level shifting circuitry, comprising:
    an input circuitry configured to receive an input signal, comprising:
    a first transistor coupled to a first supply voltage; and
    a second transistor, wherein the first and second transistors are configured to receive the input signal at their respective gate terminals, and the input circuitry is configured to output a first signal from between the first and second transistors;
    a cross-junction circuitry configured to receive the first signal, comprising:
    a third transistor coupled to a second power supply;

a fourth transistor coupled between the third transistor and a first node;

a fifth transistor coupled to the second power supply;

a sixth transistor coupled between the fifth transistor and a second node, wherein the third, fourth, fifth, and sixth transistors are connected in a cross-junction, and the second node is configured to output a second signal from the cross-junction circuitry; and a seventh transistor configured to selectively discard charge from the first node to a common return based at least in part on the first signal coupled to a gate terminal of the seventh transistor;

an output staging circuitry configured to transmit an output from the level shifting circuitry, comprising:

an eighth transistor coupled to the second power supply and configured to receive the second signal from the second node at a gate terminal of the eighth transistor;

a ninth transistor coupled to the eighth transistor and coupled to the second power supply at a gate terminal of the ninth transistor, wherein the output is derived between the eighth and ninth transistors;

a tenth transistor coupled to the ninth transistor and a variable voltage line and configured to receive the second signal from the second node at the gate terminal of the eighth transistor; and an eleventh transistor coupled in parallel to the tenth transistor between the ninth transistor and the variable voltage line and configured to bleed charge as a bled charge from the output to reduce voltage stress on the tenth transistor.

16. The level shifting circuitry of claim 15, wherein the eleventh transistor is configured to receive the first signal at a gate terminal of the eleventh transistor.

17. The level shifting circuitry of claim 15, wherein the eleventh transistor is smaller than the tenth transistor.

18. The level shifting circuitry of claim 15, wherein the bled charge comprises a capacitive charge of an output load coupled to the output of the level shifting circuitry.

19. The level shifting circuitry of claim 15, wherein the cross-junction circuitry comprises a twelfth transistor that is configured to discharge charge from the second node to the common return based at least in part on the input signal coupled to a gate terminal of the twelfth transistor.

20. The level shifting circuitry of claim 15, wherein the eleventh transistor is of a same type as the tenth transistor, is smaller than the tenth transistor, and is configured to receive the first signal at a gate terminal of the eleventh transistor.

* * * * *